United States Patent [19]

Yukawa

[11] Patent Number: 5,544,081
[45] Date of Patent: Aug. 6, 1996

[54] OUTPUT FILTER FOR OVERSAMPLING DIGITAL-TO-ANALOG CONVERTER

[75] Inventor: Akira Yukawa, Tokyo, Japan

[73] Assignee: NEC Corporation, Tokyo, Japan

[21] Appl. No.: 294,825

[22] Filed: Aug. 26, 1994

[30] Foreign Application Priority Data

Sep. 1, 1993 [JP] Japan .................................. 5-240352

[51] Int. Cl.$^6$ .............................. G06J 1/00; G06G 7/02
[52] U.S. Cl. ........................................ 364/602; 364/825
[58] Field of Search ................................. 364/825, 607, 364/602

[56] References Cited

U.S. PATENT DOCUMENTS

| | | | |
|---|---|---|---|
| 4,566,119 | 1/1986 | Peters | 333/28 T |
| 4,667,298 | 5/1987 | Wedel, Jr. | 364/825 |
| 4,855,944 | 8/1989 | Hart | 364/607 |
| 4,968,989 | 11/1990 | Olmstead et al. | |
| 5,008,674 | 4/1991 | DaFranca et al. | |
| 5,012,245 | 4/1991 | Scott et al. | |
| 5,061,925 | 10/1991 | Sooch et al. | |
| 5,072,219 | 12/1991 | Boutaud et al. | |
| 5,325,322 | 6/1994 | Bailey et al. | 364/825 |

OTHER PUBLICATIONS

Su, et al., "A CMOS Oversampling D/A Converter with a Current–Mode Semi–Digital Reconstruction Filter", Feb. 1993, IEEE International Solid–State Circuits Conference, Digest of Technical Papers, pp. 230–231.
Crouse et al, "Tranversal Filter with Analog–Digital Component", IBM Tech Disclosure Bull vol. 11, No. 7 Dec. 1968, pp. 884–885.

*Primary Examiner*—Tan V. Mai
*Attorney, Agent, or Firm*—Whitham, Curtis, Whitham & McGinn

[57] ABSTRACT

In an output filter for an oversampling digital to analog (D-A) converter, an n-tap finite impulse response (FIR) filter of a predetermined characteristic includes a predetermined number of D-type flip-flops (DFFs) and resistors connected to individual taps, and a one-bit output of a delta-sigma modulator 2 is inputted. The filter includes a number of DFFs $11_1$ to $11_{n-1}$ commensurate with a number n of taps of the FIR filter connected in cascade and resistors $R_0$ to $R_{n-1}$ connected between tap outputs (Q), (/Q) of the DFFs and a common output terminal (A) of the FIR filter and having resistance values which are in proportion to reciprocal absolute values of filter tap coefficients. For the tap outputs of the DFFs $11_1$ to $11_{n-1}$, the positive outputs (Q) or the inverting outputs (/Q) are selected in accordance with the positive or negative sign of the tap coefficients. In another form, the tap outputs (Q or /Q) of the DFFs which are not selected for connection to the positive output terminal of the FIR filter are connected in common to a inverting output terminal (/A) of the FIR terminal by way of resistors $R_0'$ to $R_{n-1}'$ which have resistance values equal to corresponding resistors $R_0$ to $R_{n-1}$, respectively.

5 Claims, 6 Drawing Sheets

OUTPUT FILTER FOR OVERSAMPLING DIGITAL-TO-ANALOG CONVERTER

BACKGROUND OF THE INVENTION

1. Field of the Invention

This invention relates to an output filter for an oversampling digital-to-analog (hereinafter referred to as D-A) converter, and more particularly to an output filter for an oversampling D-A converter for converting a delta-sigma modulation output obtained by single-bit quantization by D-A conversion and filtering the same.

2. Description of the Related Art

An oversampling D-A converter based on the delta-sigma modulation technique allows reduction of the bit number to 1 and, even where the converter has a low resolution, allows achievement of a high signal-to-noise ratio (S/N ratio) and reduction of distortion caused by D-A conversion. Therefore, oversampling D-A converters are employed in the digital audio field in place of D-A converters of high accuracy which have conventionally been required.

FIG. 1 shows the basic construction of the oversampling D-A converter described above. The oversampling D-A converter shown is constituted from an inner digital filter 1, a delta-sigma modulator 2, a one-bit D-A converter 3, and a post filter 4 which serves as an output filter. An input signal such as a digitalized audio signal is inputted to the delta-sigma modulator 2 after the sampling frequency is raised to from several tens to approximately 200 times the sampling frequency of the input signal by the inner digital filter 1. The digital signal sampled with the raised frequency is quantized by one-bit quantization by the delta-sigma modulator 2 and is then converted into an analog signal by the next one-bit D-A converter 3, whereafter it is sent to the output filter 4 at the next stage. The output filter 4 removes high frequency noise components from the analog signal inputted thereto and outputs a signal of good reconstructed waveform.

The output filter 4 is constituted from an active filter including a plurality of stages, for example, as shown in FIG. 2. Referring to FIG. 2, the one-bit quantization output (complementary outputs) of the delta-sigma modulator 2 are inputted directly to the active filter 4. The present construction can be considered, as far as the input to the active filter 4 is concerned, equivalent to a construction wherein an output analog signal of the one-bit D-A converter 3 of FIG. 1 is inputted to the active filter 4. In particular, since the one-bit quantization output of the delta-sigma modulator 2 is either "1" or "0" and the D-A converter 3 which converts the one-bit output into an analog signal converts the outputs "1" and "0" into signals of amplitudes of, for example, +3 volts and 0 volts, respectively, the one-bit quantization output and the output analog signal of the D-A converter 3 are different only in amplitude and, as an input to the active filter 4, can be considered equivalent.

Digital FIR (Finite Impulse Response) filters, which are widely employed as filters of a constant group delay in the digital technical field, are sometimes constructed in a manner such as shown in FIG. 3 for use as an output filter 4. The FIR filter of FIG. 3 is constructed so as to receive a digital signal of a plurality of bits as an input signal thereto.

The conventional filter described above, however, has the following problems.

When it is intended to apply the conventional FIR filter to the D-A converter of FIG. 1, if D-A conversion is performed on the input side, a large number of analog delay elements are required. An example is shown in FIG. 3 wherein a CCD (Charge Coupled Device) is employed for delay elements D. However, since the CCD does not have a satisfactory characteristic as a delay element and cannot have a high S/N ratio, it cannot be applied to a D-A converter of high accuracy. Further, since a filter which employs a CCD requires a high voltage, it cannot be formed as an integrated circuit together with a large digital circuit.

Regarding the technology in which the active filter of FIG. 2 is employed, in order to construct a high-performance delta-sigma modulator, it is necessary to make the degree of noise shaping filters in the modulator equal to or greater than 4. Accordingly, in order to remove quantization noise that has undergone noise shaping, the cutoff characteristic for high frequencies of the active filter of the output filter 4 at the output stage of the one-bit D-A converter 3 must be somewhat steep. Accordingly, the degree of the active filter 4 must be made equal to or higher than 5.

Since a signal obtained by D-A conversion from one-bit data by the delta-sigma modulator 2 has much higher noise of high frequencies outside the signal bandwidth than another signal obtained by D-A conversion of an ordinary signal of, for example, 16 bits, the frequency characteristic of operational amplifiers employed for the active filter must be wide.

The presence of high-frequency noise outside the signal bandwidth signifies that original signal components in a one-bit D-A conversion output are reduced to a comparatively low level, and accordingly, the filter must process a voltage amplitude several times higher than the voltage amplitude which is originally required for an output.

Furthermore, because an active filter of a single stage cannot remove noise, a filter having a plurality of stages is necessary, thereby resulting in a complicated circuit and a necessity to design the output amplitude of the filter at the first stage with a sufficient margin for the amplitude of an original signal. Accordingly, the output signal amplitude of the filter at the first stage is restricted by the range of the output voltage of the operational amplifier and must be set considerably lower than the power source voltage.

Since a one-bit output includes a large volume of high-frequency noise, the first stage of the active filter must have a frequency characteristic capable of follow-up to extremely high frequencies, resulting in high power consumption. Further, since the ratio between the peak value of the one-bit output and the peak value of an original signal is high, the first stage of the filter must have the characteristics of very low noise and a wide dynamic range. Accordingly, designing the filter to operate with a reduced voltage results in a reduction of the power source voltage and a consequent decrease in the one-bit output voltage. The signal component included in the one-bit output voltage is therefore further reduced, causing the influence of circuit noise to increase, and as a result, the characteristics cannot be assured.

Furthermore, since the cutoff frequency of an ordinary active filter depends upon the product of the capacitance and the resistance value of elements, each of which have dispersion independently of each other, the accuracy of the filter characteristic cannot be maintained due to the dispersion, and it is very difficult to integrate the filter with D-A converters.

An increase of the degree of filters signifies an increase in the number of necessary operational amplifiers, and the increased distortion and noise produced by the operational amplifiers prevents the maintenance of a good S/N ratio.

As a countermeasure for the drawbacks described above, a technique which employs a digital filter such as shown in FIG. 4 for the output filter 4 for one-bit data of the delta-sigma modulator 2 has been proposed by D. K. Su et al. (David K. Su, Bruce A. Wooley, "A CMOS Oversampling D/A Converter with a Current-Mode Semi-Digital Reconstruction Filter," 1993 IEEE International Solid-State Circuit Conference, Digest of Technology Papers, pp. 230–231).

The digital FIR filter of FIG. 4 controls current outputs of MOS transistors of current sources weighted with FIR filter coefficients in accordance with data delayed by delay elements D to produce a current sum of the current outputs and convert the current sum into a voltage by means of a current-to-voltage conversion circuit 5, and is suitable for removing the above-described high-frequency noise.

However, in order to increase the current sources in proportion to the filter coefficients with a given degree of accuracy, the filter must occupy a large area since the threshold voltage levels of the MOS transistors constituting the constant-current sources have a high dispersion. Further, from the point of view of time, about half of the current flows to the ground and is consumed to no purpose, resulting in a high current consumption.

Furthermore, in order to assure good constant-current characteristics of the current sources, MOS transistors must be arranged in cascade connection in two stages as shown in FIG. 4, and accordingly, to obtain a portable device, the power source voltage must be limited to approximately 3 volts.

SUMMARY OF THE INVENTION

It is an object of the present invention to solve the problems described above, and to provide an output filter for an oversampling D-A converter which can operate with a low power source voltage, which is simple in structure, and which can be easily integrated together with other circuits as an LSI.

In order to attain the object described above, according to the present invention, there is provided an output filter for an oversampling D-A converter which converts a delta-sigma modulation signal for producing one-bit quantization data by D-A conversion and outputs a resulting analog signal, wherein the output filter comprises a number n of D-type flip-flops (hereinafter referred to as DFFs) equal to a plural number n of taps for realizing a predetermined FIR filter characteristic, the DFFs being in cascade connection, and a first set of n resistors provided corresponding to the taps of the FIR filter, each resistor having a resistance value which is in inverse proportion to the absolute value of a corresponding tap coefficient, each resistor having a first terminal connected to the output of each DFF of the corresponding tap and all second terminals being connected in common to an output terminal of the FIR filter.

Preferably, the first end of each resistor is connected to the positive output of a corresponding DFF when the tap coefficients are positive in sign, and the first end of each resistor is connected to the inverting output of a corresponding DFF when the tap coefficients are negative in sign.

Preferably, the output filter for an oversampling D-A converter further comprises a low-pass filter connected to the output terminal of the FIR filter.

Preferably, the output filter for an oversampling D-A converter further comprises a second set of a number n of resistors provided corresponding to the taps of the FIR filter and having resistance values which are in inverse proportion to the absolute values of the corresponding tap coefficients of the FIR filter, the n resistors of the second set each having a first terminal connected to the output terminal of the DFF of the corresponding tap to which a resistor of the first set is not connected and a second terminal connected in common to a inverting output terminal of the FIR filter.

Preferably, the output filter for an oversampling D-A converter further comprises an active low-pass filter for receiving signals from the positive output terminal and the inverting output terminal of the FIR filter as differential inputs thereto.

In accordance with the present invention, the output filter can be extremely simplified, and besides, EMI (Electro-Magnetic Interference) radiation, which conventionally causes problems with a one-bit output configuration, can be eliminated.

Further, since noise components in a high-frequency area can be removed, satisfactory operation can be achieved even if the input voltage range of an operational amplifier of an output circuit, which is normally connected to the outside of an LSI, is narrow, and the filter can be accommodated in an LSI.

Further, where an FIR filter is employed, a filter can be constructed that is free from the phase distortion which causes problems in a conventional analog filter which requires a steep cutoff characteristic.

Furthermore, since the entire circuit construction can be made similar to that of a digital circuit except for the resistors and the output circuit, good operation can be anticipated even with a low power source voltage lower than 1 volt. When construction of LSIs in a higher density in the future creates a demand for lower power source voltage, the output filter can provide an optimum countermeasure.

In addition, in a second embodiment, parallel outputs are obtained. Accordingly, noise produced by a power source, which is a problem with an LSI including an analog circuit, can be reduced by approximately 60 dB, and there is an advantage in that the output filter of the second embodiment can output a voltage twice that of an output filter of the first embodiment.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 5:
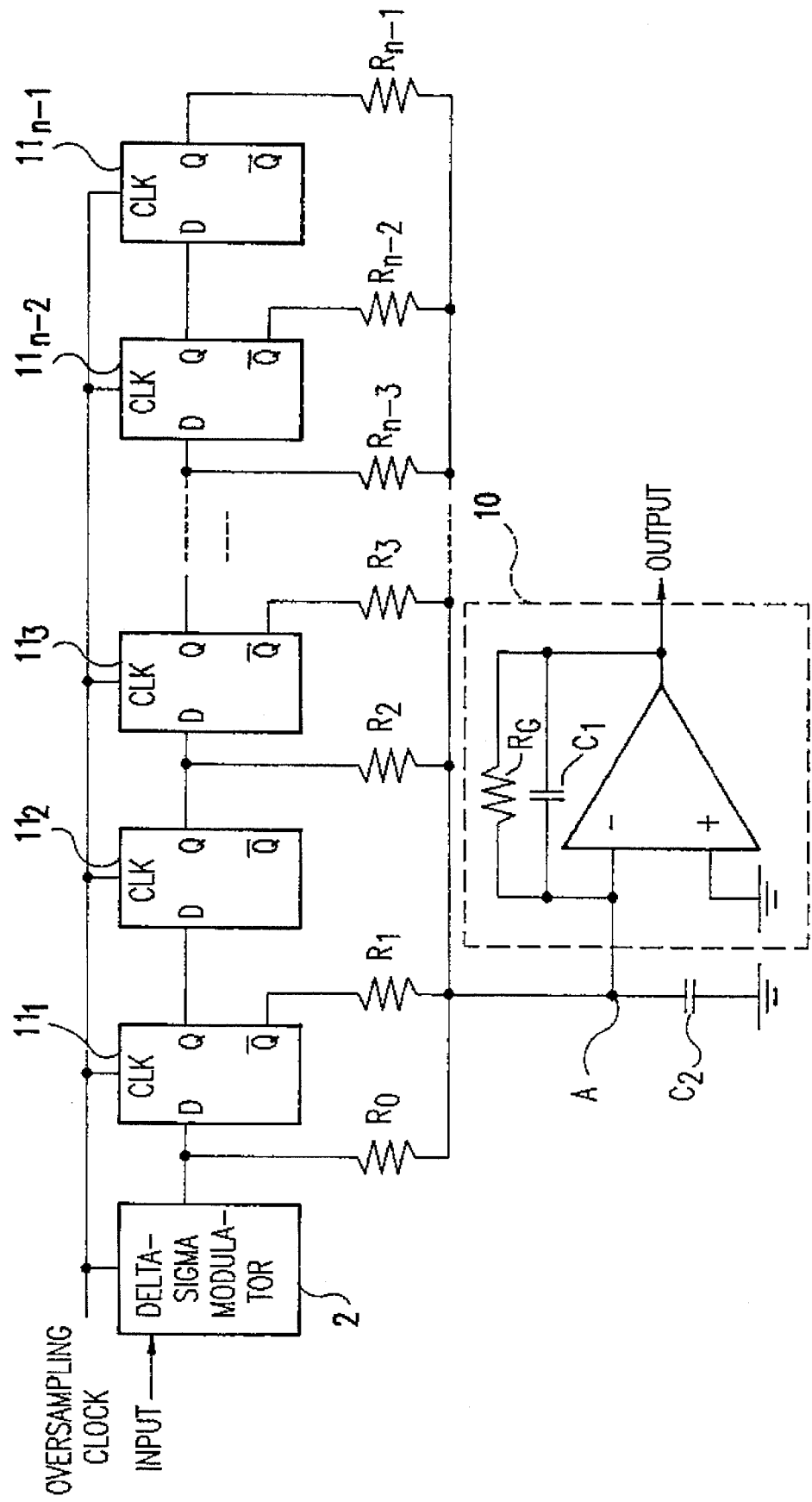
FIG. 5 is a block circuit diagram of a first embodiment of an output filter for an oversampling D-A converter according to the present invention.

An oversampling D-A converter in the present embodiment includes, as shown in FIG. 5, a delta-sigma modulator 2 for converting an input digital signal into a one-bit high-speed signal, n-1 DFFs $11_1$ to $11_{n-1}$ for inputting a one-bit output of the delta-sigma modulator 2 and producing delay data corresponding to n taps of an FIR filter constituted from the DFFs $11_1$ to $11_{n-1}$, a resistor $R_0$ connected to the output of the delta-sigma modulator 2 and an output terminal A of the FIR filter, a set of resistors $R_1$ to $R_{n-1}$ having first terminals connected to the positive (Q) outputs or the inverting (/Q) outputs of the corresponding DFFs and the other terminals connected in common to the output terminal A and having resistance values which are in inverse proportion to the absolute values of the tap coefficients of the FIR filter, and an output circuit 10 of a low-pass filter (hereinafter referred to as LPF) construction for converting a signal inputted thereto from the output terminal A by low-pass conversion and outputting a resulting signal.

The n-1 DFFs $11_1$ to $11_{n-1}$ operate in synchronism with an oversampling clock signal and output a one-bit signal inputted to the DFF $11_1$ at the first state from the delta-sigma modulator 2 as delay data corresponding to the n taps of the FIR filter to the filter output terminal A.

Further, in order to reduce the digital coupling noise of a signal to be inputted to the output circuit 10, a capacitor $C_2$ is connected to the output terminal A. The output circuit 10 has a cutoff frequency characteristic which depends upon the capacitance of a capacitor $C_1$ and the resistance of a resistor $R_G$ and a gain characteristic which depends upon the ratio between a parallel connection composite resistance RS of the resistors $R_0$ to $R_{n-1}$ and the resistance of the resistor $R_G$.

Figure 1:
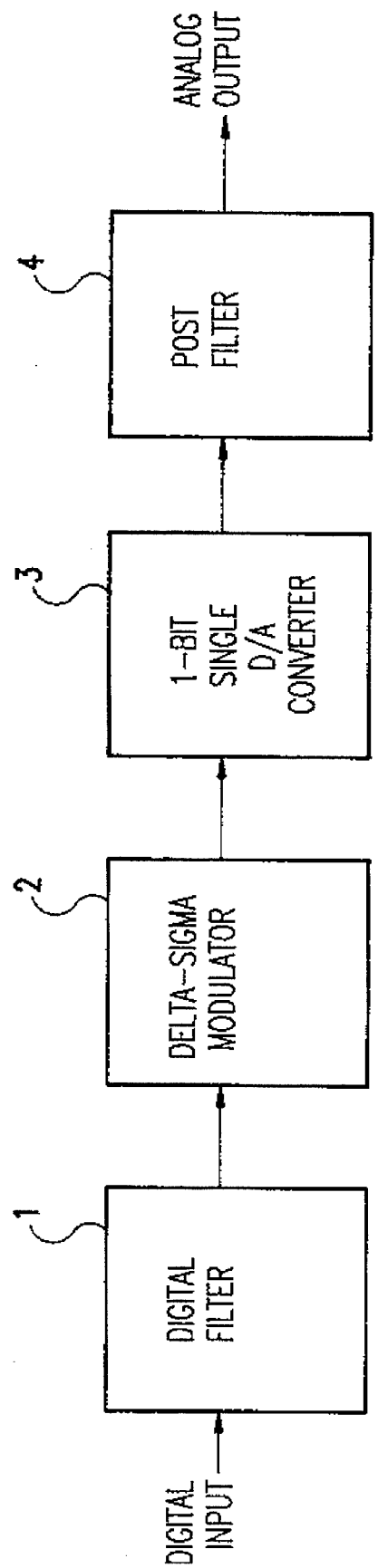
FIG. 1 is a block diagram showing the basic construction of a general oversampling D-A converter.
Figure 2:
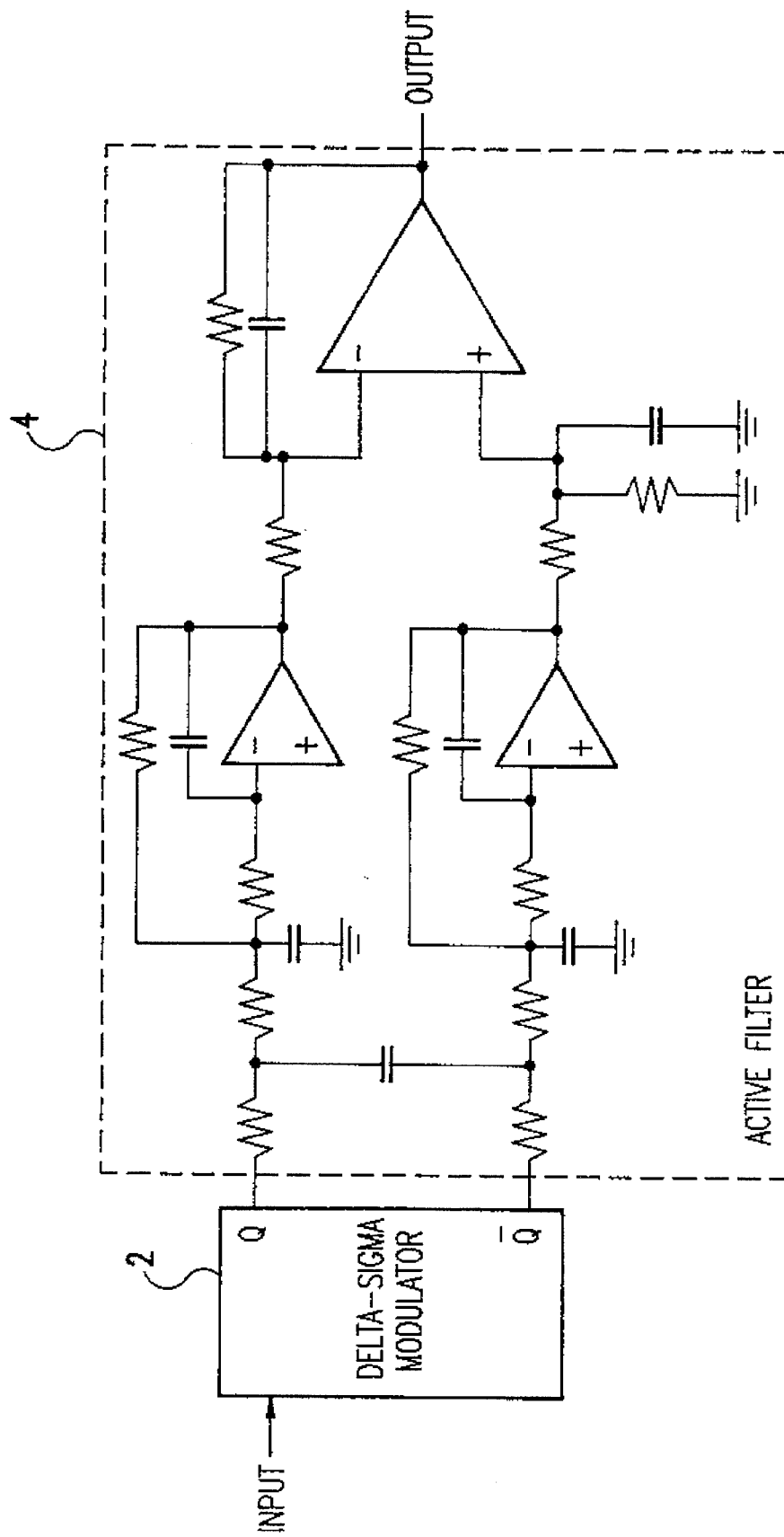
FIG. 2 is a circuit diagram of an example of a conventional oversampling D-A converter.
Figure 3:
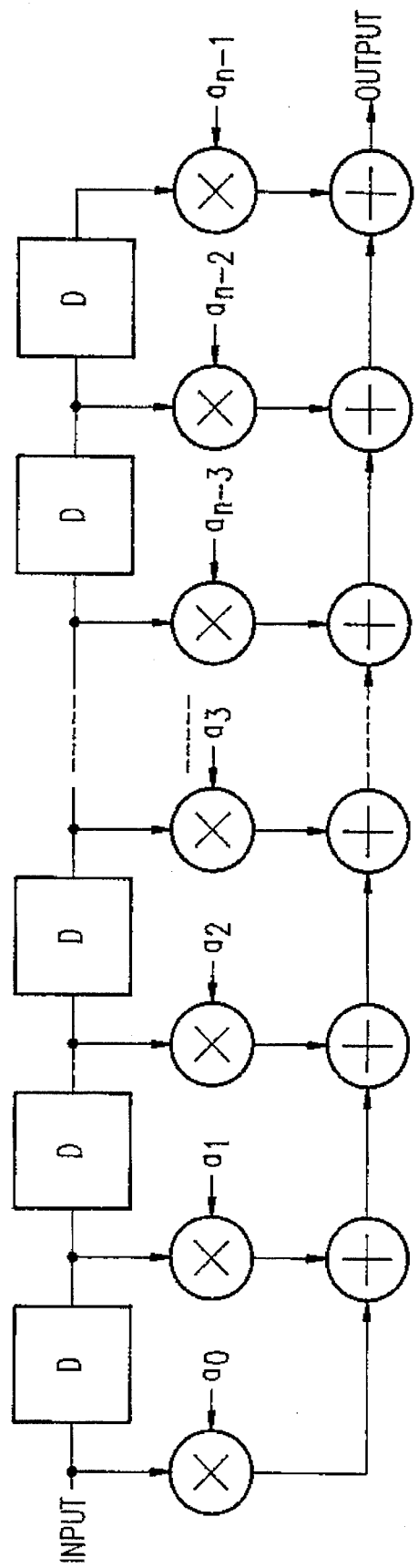
FIG. 3 is a circuit diagram of signal lines of a general FIR filter.
Figure 4:
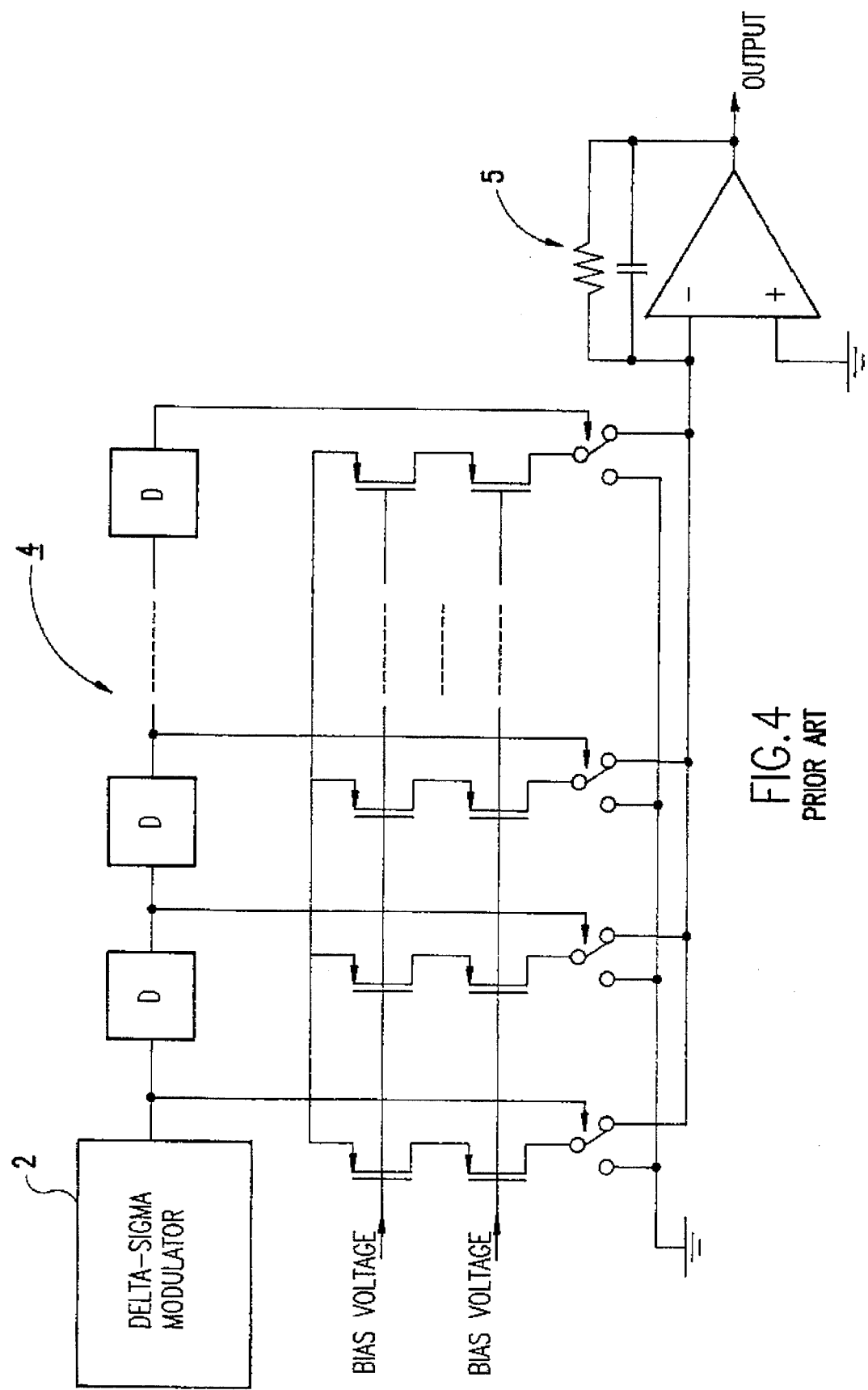
FIG. 4 is a circuit diagram of another example of a conventional oversampling D-A converter.

Next, operation of the present embodiment is described with reference to FIGS. 1 and 5.

Input data of a digital signal are quantized into one-bit data by the delta-sigma modulator 2 after the sampling frequency is changed to, for example, 128 times that of the digital signal by the inner digital filter 1. One-bit data produced in the period of an oversampling clock is converted to delayed data by the DFFs which are in cascade connection similarly to those of an ordinary FIR digital filter and are controlled by the oversampling clock signal.

Here, the number of stages of the DFFs is preferably equal to or higher than two but lower than approximately two times the oversampling ratio, that is, the ratio between the frequency of oversampling clocks and the sampling frequency of the original input signal.

The resistance values of the resistors $R_0$ to $R_{n-1}$ connected to the output of the delta-sigma modulator 2 and the outputs of the DFFs $11_1$ to $11_{n-1}$ are set to values which are in inverse proportion to filter coefficients of the FIR filter. For simplification, an FIR filter having three taps is considered. Here, since the filter coefficients most preferably have a ratio of 1:2:1, the resistance ratio should be 2:1:2. Thus, the resistance values are set to 20 kΩ : 10 kΩ : 20 kΩ. In this instance, since the tap coefficients are all positive in sign, the resistors are connected to the positive outputs (Q) of the taps. The composite resistance value of the resistors is 5 kΩ.

In this instance, the currents flowing from the individual taps into the output terminal A have a ratio of 1:2:1 and are thus composed correctly, and the transfer function is $k(1+2z^{-1}+z^{-2})$. Here, k is a gain coefficient which depends upon the ratio to the impedance $R_z$ of the output stage.

It is to be noted that, when the tap coefficients are negative in sign, the resistors are connected to the inverting outputs (/Q) of the corresponding DFFs.

Where the number of taps is 3, the outside-band blocking characteristic is poor, but since noise of frequencies higher than approximately one half the oversampling frequency can be reduced to approximately 1/100, unnecessary radiation, known as EMI (Electro-Magnetic Interference) noise, can be reduced. Naturally, it is possible to increase the number of taps to reduce the frequencies outside the signal band by a greater amount.

The one-bit D-A converter 3 which is used for the output of the delta-sigma modulator 2 and the output of the DFFs can be realized sufficiently from a CMOS integrated circuit, wherein inverted amplification circuits having pulse rising and falling characteristics and uniform delay characteristics are connected to a power source of low impedance.

Figure 6:
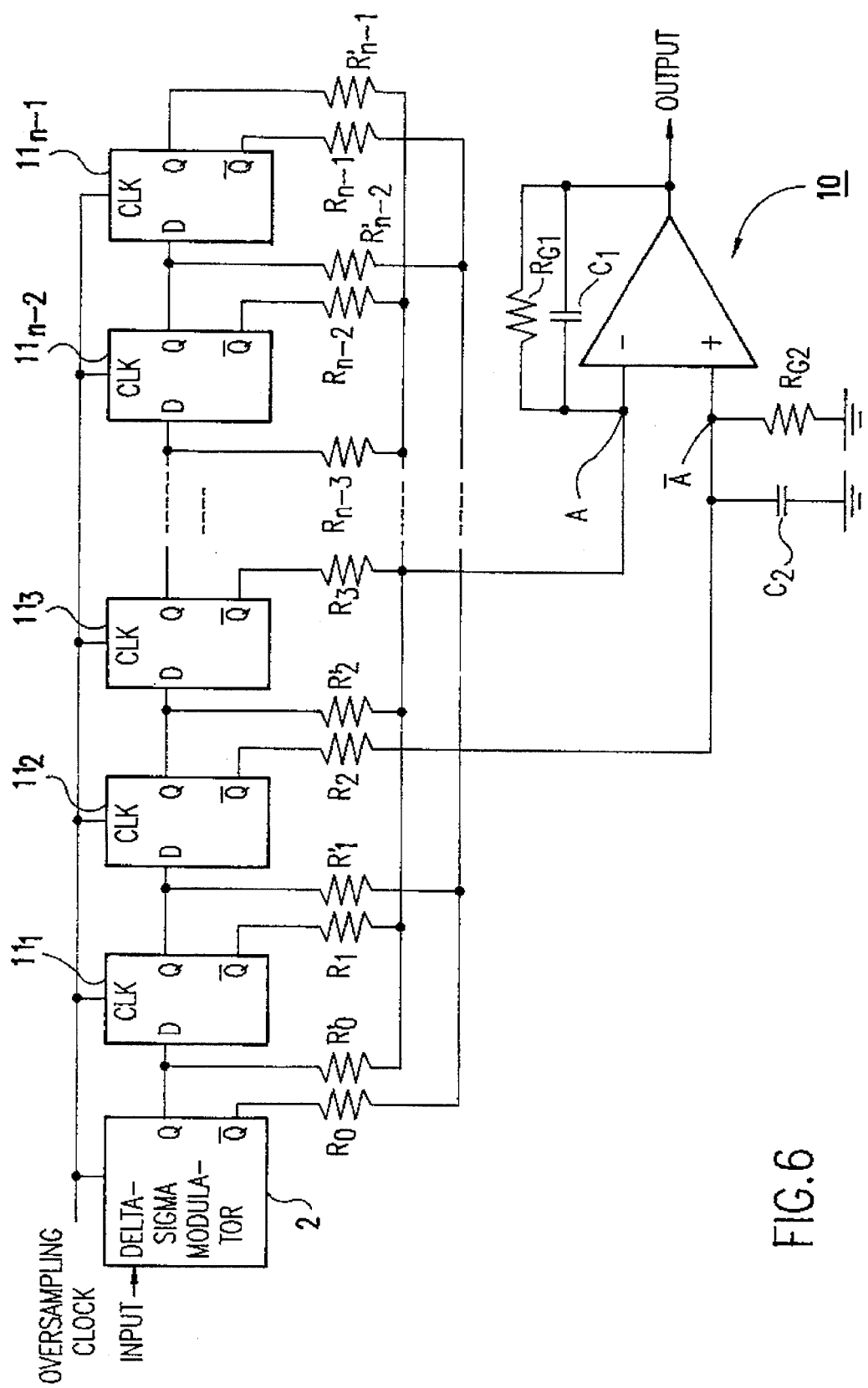
FIG. 6 is a block circuit diagram of a second embodiment of the present invention.

Next, a second embodiment of the present invention is described with reference to the block circuit diagram of FIG. 6. Parts in FIG. 6 that are the same as those in the first embodiment are denoted by the same reference characters.

The present second embodiment includes similar components to those of the first embodiment described above, that is, a delta-sigma modulator 2 for converting an input digital signal into a one-bit high-speed signal, n-1 DFFs $11_1$ to $11_{n-1}$ for inputting an output of the delta-sigma modulator 2 and producing delay data corresponding to n taps of an FIR filter constituted from the DFFs $11_1$ to $11_{n-1}$, and a first set of resistors $R_0$ to $R_{n-1}$ having first terminals connected to the positive (Q) or inverting (/Q) outputs of the corresponding DFFs and the other terminals connected in common to a filter output terminal A and having resistance values in inverse proportion to the absolute values of the tap coefficients of the FIR filter, as well as a second set of resistors $R_0'$ to $R_{n-1}'$ having first terminals connected to those positive (Q) or inverting (/Q) outputs of the DFFs to which the first set of resistors are not connected and second terminals connected in common to a inverting output terminal (/A) of the FIR filter.

Each of the second set of resistors $R_0'$ to $R_{n-1}'$ has a resistance value equal to a corresponding resistor of the first set of resistors $R_0$ to $R_{n-1}$, respectively.

In order to minimize digital coupling noise, a capacitor $C_2$ is preferably connected to the inverting output terminal (/A).

The frequency cutoff characteristic of an LPF 10 of an output circuit depends upon the time constant of a capacitor $C_1$ and a resistor $R_G$, and the gain characteristic depends upon the ratio between a composite resistance value $R_S$ of the resistors $R_0$ to $R_{n-1}$ connected in parallel and the resistance value of the resistor $R_G$.

In the second embodiment, if the number of taps is 3, as in the first embodiment, and the tap coefficients are also the same as in the first embodiment, the most preferable values of the filter coefficients are in a ratio of 1:2:1, and accordingly, the resistance ratio is 2:1:2. Accordingly, where the resistance values are set to 20 kΩ: 10 kΩ: 20 kΩ, since the tap coefficients are all positive in sign, the resistors in the first set are connected to the positive outputs (Q) of the taps of the DFFs while the resistors in the second set are connected to the inverting outputs (/Q) of the taps of the DFFs. The composite resistance value of the resistors is 5 kΩ. In this instance, the currents to flow into the output terminal point A from the taps are in a ratio of 1:2:1 and are composed correctly, and the transfer function is $k(1+2z^{-1}+z^{-2})$.

It is to be understood that variations and modifications of an output filter for an oversampling digital-to-analog converter disclosed herein will be evident to those skilled in the art. It is intended that all such modifications and variations be included within the scope of the appended claims.

What is claimed is:

1. An output filter for an oversampling digital-to-analog converter for converting one-bit quantization data output from a delta-sigma modulator by digital-to-analog conversion and outputting a resulting analog signal, said output filter comprising:

- a plurality of D-type flip-flops commensurate with n taps for providing a predetermined finite impulse response filter characteristic, said D-type flip-flops being connected in cascade;
- a first set of n first resistors corresponding to said taps of said output filter and including resistance values which are in inverse proportion to absolute values of corresponding tap coefficients, each of said first resistors including a first terminal connected to one of a first output terminal and a second output terminal of respective ones of said D-type flip-flops and a second terminal connected to a common output terminal of said output filter;
- a second set of n second resistors including resistance values which are in proportion to absolute values of corresponding tap coefficients and each of said second resistors including a first terminal connected to one of said first and said second output terminal of respective ones of said D-type flip-flops a second terminal connected to a common inverting output terminal of said output filter;
- wherein said first terminals of said first resistors and said first terminals of respective ones of said second resistors are connected to different output terminals of respective ones of said D-type flip-flops.

2. An output filter for an oversampling digital-to-analog converter as claimed in claim 1 that further comprises an active low-pass filter for receiving signals from the common output terminal and the common inverting output terminal of said output filter as differential inputs thereto.

3. An output filter as in claim 1, wherein said first terminals of said first resistors are connected to said first output terminals of respective ones of said D-type flip-flops when the tap coefficients are positive and connected to said second output terminals of respective ones of said D-type flip-flops when the tap coefficients are negative; and said first terminals of said second resistors are connected to said second output terminals of respective ones of said D-type flip flops when the tap coefficients are positive and connected to said first output terminals of respective ones of said D-type flip-flops when the tap coefficients are negative.

4. An output filter as in claim 3, wherein said first output terminals of said D-type flip-flops are positive and said second output terminals of said D-type flip-flops are negative.

5. An output filter as in claim 1, further comprising:

- a first input tap connected to a first output of said delta-sigma modulator;
- a second input tap connected to a second output of said delta-sigma modulator;
- a first resistor including a first terminal connected to said first input tap and a second terminal connected to said common output terminal; and
- a second resistor including a first terminal connected to said second input tap and a second terminal connected to said common inverting output terminal.

* * * * *